United States Patent
Kattainen et al.

(10) Patent No.: US 11,242,221 B2
(45) Date of Patent: Feb. 8, 2022

(54) SENSOR CONNECTING UNIT, SAFETY SYSTEM AND ELEVATOR

(71) Applicant: KONE Corporation, Helsinki (FI)

(72) Inventors: Ari Kattainen, Hyvinkää (FI); Antti Hovi, Hyvinkää (FI)

(73) Assignee: KONE CORPORATION, Helsinki (FI)

( * ) Notice: Subject to any disclaimer, the term of this patent is extended or adjusted under 35 U.S.C. 154(b) by 613 days.

(21) Appl. No.: 15/270,750

(22) Filed: Sep. 20, 2016

(65) Prior Publication Data

US 2017/0101290 A1    Apr. 13, 2017

(30) Foreign Application Priority Data

Oct. 7, 2015  (EP) ..................................... 15188849

(51) Int. Cl.
| | |
|---|---|
| *B66B 5/00* | (2006.01) |
| *H02J 9/00* | (2006.01) |
| *H02H 1/06* | (2006.01) |
| *B66B 13/22* | (2006.01) |
| *B66B 13/00* | (2006.01) |
| *G01R 31/327* | (2006.01) |
| *H01H 47/00* | (2006.01) |

(52) U.S. Cl.
CPC ............ *B66B 5/0031* (2013.01); *B66B 13/00* (2013.01); *B66B 13/22* (2013.01); *G01R 31/3271* (2013.01); *H01H 47/002* (2013.01); *H02J 9/005* (2013.01)

(58) Field of Classification Search
USPC ........................................................ 187/317
See application file for complete search history.

(56) References Cited

U.S. PATENT DOCUMENTS

| | | | | |
|---|---|---|---|---|
| 6,056,088 | A * | 5/2000 | Gerstenkorn | ......... B66B 5/0031 187/390 |
| 8,230,978 | B2 * | 7/2012 | Agirman | ................. B66B 5/027 187/290 |
| 2009/0120725 | A1 * | 5/2009 | Syrman | ..................... B66B 1/30 187/276 |
| 2013/0271152 | A1 | 10/2013 | Kattainen et al. | |
| 2017/0362055 | A1 * | 12/2017 | Kattainen | ................. B66B 1/28 |
| 2018/0215579 | A1 * | 8/2018 | Knecht | ................. B66B 5/0031 |

FOREIGN PATENT DOCUMENTS

WO    WO 2009/068724 A1    6/2009

* cited by examiner

*Primary Examiner* — Christopher Uhlir
(74) *Attorney, Agent, or Firm* — Birch, Stewart, Kolasch & Birch, LLP (57) ABSTRACT

A sensor connecting unit includes a safety input for connecting with a sensor; a power supply that is controllable through a controllable power switch; and a first I/O processing unit and a second I/O processing unit being connected to each other through a reciprocal comparison communication channel. The first I/O processing unit and the second I/O processing unit are both connected through a measurement circuit to measure voltage, current or power between a reference input and the safety input, and connected to a safety bus. The first I/O processing unit informs the second I/O processing unit about switching off of the controllable power supply, the second I/O processing unit commands the first I/O processing unit to switch off the controllable power supply, and/or the second I/O processing unit measures an output of the controllable power switch to detect switching of the power switch.

19 Claims, 6 Drawing Sheets

SENSOR CONNECTING UNIT, SAFETY SYSTEM AND ELEVATOR

FIELD OF THE INVENTION

The invention relates to reading of sensors and obtaining input from a sensor for a safety logic unit. Certain aspects of the invention relate to elevators.

TECHNICAL BACKGROUND

In complex systems, such as elevators, the reading of sensors consumes much energy since, on one hand, in order to be reliable, certain sensors may need to be operated with a relatively high voltage (such as approximately 100 Volts DC), on the other hand because of the large number of sensors that may be present in the complex system. For example, an elevator may have dozens of sensors installed when the elevator has been installed in a multi-store building.

To reduce energy consumption by elevator control appliances such as sensors, the present applicant has proposed in international patent application published under publication number WO 2009/068724 A1 (hereinafter the '724 patent application) an elevator system that comprises a number of elevator control appliances, also including sensors. The sensors are switched on for measuring only for a limited time and for the remaining time they are switched off.

OBJECTIVE OF THE INVENTION

Due to the complexity of elevator systems the sensors are usually located at different floors in a multi-store building, for example—the sensors are currently measured by sensor connecting units. A number of such sensor connecting units are then connected to a safety logic unit that is further connected to a number of safety actuators. The safety logic unit determines using its logic, whether any of the safety actuators need be used. Some or all of the sensor connecting units are usually located remotely from the safety logic unit while some may be located locally at or in the safety logic unit.

The present applicant is planning to implement sensor connecting units to have at least two I/O processing units, such as CPU:s or microcontrollers. The at least two I/O processing units will both individually determine what is the sensor output, and use in the determining at least some data measured through the safety input of another I/O processing unit of the sensor connecting unit by using a reciprocal communication bus. The sensor output(s) is (are) then communicated to the safety logic unit.

In order to simplify the design of the sensor connecting unit, the present applicant plans to use one of the I/O processing units in its elevator systems to switch sensor connecting units on and off to save energy. The resistors in the measuring circuit will, after switching off the power supply, not dissipate energy thus contributing to the environment-friendliness of the elevator system.

The present inventors have found out that the objective of saving energy and the use of at least two I/O processing units individually determining the sensor output may actually be contradicting.

An objective of the present invention is to improve the reliability of the sensor connecting unit, and in the first place also to reduce the risk of sending false sensor output(s) to the safety logic unit. This objective can be fulfilled with the sensor connecting unit according to claim 1, with the safety system according to claim 11 and with the elevator according to claim 13.

The dependent claims describe various advantageous aspects of the sensor, safety system and of the elevator.

Advantages of the Invention

A sensor connecting unit comprises:
- a safety input for connecting with a sensor, or, alternatively, a first sensor connected to a first safety input and a second sensor connected to a second safety input;
- a power supply that is controllable through a controllable power switch, or, alternatively, a controllable power supply;
- a first I/O processing unit and a second I/O processing unit being connected to each other through a reciprocal comparison communication channel; and
- the first I/O processing unit and the second I/O processing unit both connected through a measurement circuit to measure voltage, current or power between a reference input and the first safety input and/or the second safety input, and connected to a safety bus.

The first I/O processing unit is configured to control the controllable power switch or, alternatively, the controllable power supply.

Furthermore, in the sensor connecting unit:
i) the first I/O processing unit is configured to inform the second I/O processing unit about switching of the power switch or, alternatively, of the controllable power supply, preferably through the reciprocal comparison communication channel or an input line branched from a control line used to control the controllable power switch or alternatively, the controllable power supply;
and/or
ii) the second I/O processing unit is configured to command the first I/O processing unit to switch the power switch or, alternatively, of the controllable power supply, preferably through the reciprocal comparison communication channel;
and/or
the second I/O processing unit is configured to measure an output of the controllable power switch or, alternatively, of the controllable power supply to detect switching of the power switch or, alternatively, of the controllable power supply.

With the option i), ii) or iii), the second I/O processing unit will thus know that the power switch (or, alternatively, the controllable power supply) will be (or has been) switched off and so the risk of obtaining a false sensor output at the safety logic unit can be reduced.

When the first I/O processing unit is configured to delay the switching of the power switch (or, alternatively, of the controllable power supply), for a predetermined period after informing the second I/O processing unit or after having been commanded by the second I/O processing unit, it can be ensured that also the second I/O processing unit will know that the power switch will be switched off. Particularly advantageously, the first I/O processing unit may be configured to switch the controllable power switch on for 10 to 50 ms and then to switch it off. Such a time window suffices to read the sensor input reliably.

The sensor connecting unit preferably is connected to a sensor. In practice, the sensor may be a safety contact with at least one direct opening action contact, a safety switch with at least one safety output, or two or more non-safety switches.

The sensor is preferably connected between the first safety input and the second safety input; if there are two sensors, the first sensor is preferably connected between the safety input supply and the first safety input and the second sensor is preferably connected between the safety input supply and the second safety input.

The measurement circuit may be configured to dissipate electric power from the power supply (or alternatively, from the controllable power supply), and/or to lead electric current to ground so that a sensor ensuring voltage is reduced in the measurement circuit to a level accepted by an ADC line of the first I/O processing unit and of the second I/O processing unit. This set-up enables the use of a voltage that is high enough to ensure a sensor. Preferably, the sensor ensuring voltage over the sensor may be equal or greater than 9 V, preferably at least 90 V, whereas the voltage at the ADC line of the first I/O processing unit and of the second I/O processing unit may be less than 5 V, preferably 1.5 V to 3 V.

The first I/O processing unit may have at least two time windows, the duration of which are different from each other, and during which the power switch or (alternatively, the controllable power supply) is controlled i.e. switched on or off. This enables the use of a longer time window for normal operation and a shorter time window for idle operation. For standby operation, the controllable power switch can remain switched off.

A safety system comprises a number of sensor connecting units according to the first aspect of the invention, and at least one safety logic unit connected or connectable to the number of sensor connecting units locally and/or through a safety bus and having a first safety output and a second safety output. With the safety system, the risk of obtaining false sensor output(s) to the safety logic unit can be reduced.

An elevator comprises an elevator car movable in a hoistway, the elevator car having at least one automatic or turnable car door, a number of automatic or turnable hoistway doors, and a safety system according to the second aspect of the invention and configured to control the safety of the at least one automatic or turnable car door and the number of hoistway doors. With the elevator, the risk of obtaining false sensor output(s) to the safety logic unit can be reduced. Furthermore, the safety system of the elevator can also be made to consume less energy in idle mode than in normal operation and in standby mode even less energy.

This is particularly the case if the sensor connecting unit is configured to use a shorter off-time window to measure safety when the elevator is in normal operation mode and a longer off-time window when the elevator is in idle mode. When the elevator is in standby mode, the controllable sensor can remain switched off.

LIST OF DRAWINGS

In the following, the invention is explained in more detail by way of examples shown in the attached drawings in FIGS. 1 to 6, of which.

Same reference numerals refer to same components in all FIG.

DETAILED DESCRIPTION

Figure 1:
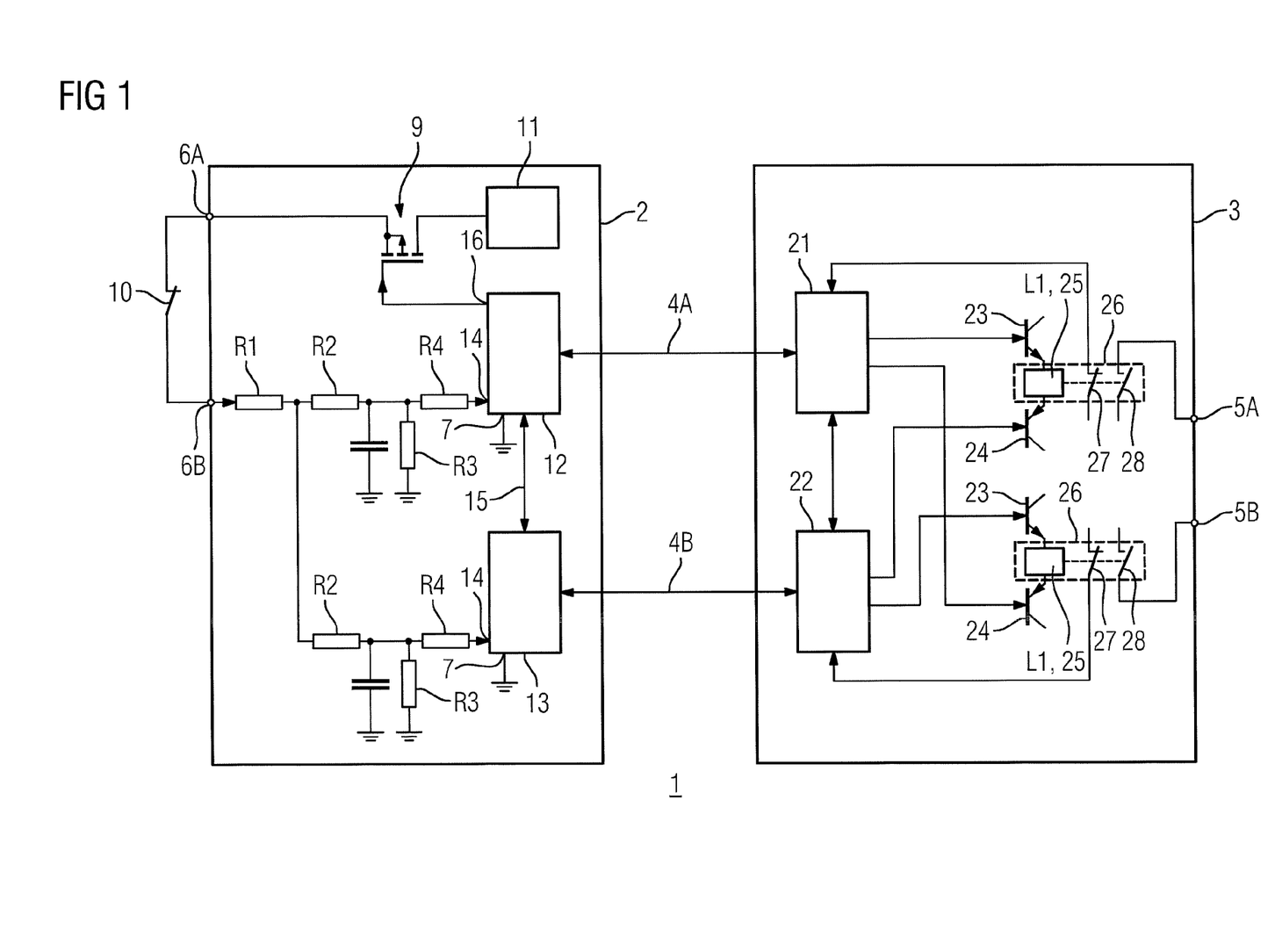
FIG. 1 illustrates a safety system having a sensor connecting unit connected to a sensor through a safety input supply and a safety input, one I/O processing unit informing the other I/O processing unit through a reciprocal comparison communication channel.

FIG. 1 illustrates a safety system 1 having one sensor connecting unit 2 connected to a sensor 10 through a safety input supply 6A and a safety input 6B and further with a safety logic unit 3 through safety bus 4A, 4B. The safety bus 4A, 4B can be any field bus suitable for use as a safety bus. In practice, a serial bus can be used, for instance. The sensor 10 may be a) a safety contact with at least one direct opening action contact, b) a safety switch with at least one safety output, or b) two or more non-safety switches.

The safety system 1 comprises a number of sensor connecting units 2 and a number of safety logic units 3 connected or connectable to the number of sensor connecting units 2 locally and/or through a safety bus 4A, 4B and having a first safety output 5A and a second safety output 5B.

As explained above, there may be more than one sensor connecting units 2 connected with the safety logic unit 3. For the sake of clarity, FIG. 1 illustrates only one connecting unit 2.

The sensor connecting unit 2 further comprises a power supply 11 that is controllable through a controllable power switch 9. As an alternative to power supply 11 and controllable power switch 9, a controllable power supply can be used instead.

A first I/O processing unit 12 and a second I/O processing unit 13 are connected to each other through a reciprocal comparison communication channel 15. The first I/O processing unit 12 and the second I/O processing unit 13 are both connected, for example via ADC line 14, to a measurement circuit (of which resistors R1, R2, R3, R4 and capacitance C1 are illustrated; the measurement circuit can of course have any other suitable configuration) to measure voltage, current or power between the the safety input 6B and the reference input 7 (preferably, the common ground). Furthermore, the first I/O processing unit 12 and the second I/O processing unit 13 are both connected to a safety bus 4A, 4B.

The first I/O processing unit 12 has been configured to control the power switch 9.

The first I/O processing unit 12 has been configured to inform the second I/O processing unit 13 about switching of the power switch 9 or, alternatively, of the controllable power supply, preferably through the reciprocal comparison communication channel 15. Instead of this or in addition, the second I/O processing unit 13 has been configured to command the first I/O processing unit 12 to switch the power switch 9, preferably through the reciprocal comparison communication channel 15.

In FIG. 1, the signal from the safety input supply 6A is branched to the first I/O processing unit 12 and to the second I/O processing unit 13.

Alternatively, if two sensors 10 are used, the sensors 10 may have a common safety input supply 6A and each of the I/O processing units 12, 13 can have a dedicated safety input 6B. In this case the sensor connecting unit 2 would comprise at least three pins for connecting with the two sensors 10.

A further alternative is that each I/O processing unit 12, 13 has a dedicated safety input supply 6A and a dedicated safety input 6B.

The idea is that the controllable power switch 9 can be used to switch off the power, current and/or voltage output from the power source 11 to the sensor 10. When the power, current and/or voltage is switched off, the power dissipation at the measurement circuit goes quickly to zero.

The sensor connecting unit 2 may further comprise a sensor 10 connected between the safety input supply 6A and the safety input 6B.

The measurement circuit is configured to dissipate electric power form the power supply 9 and/or to lead electric current to ground so that a sensor ensuring voltage can be reduced in the measurement circuit to a level accepted by an ADC line 14 of the first I/O processing unit 12 and of the second I/O processing unit 13.

The sensor ensuring voltage over the sensor 10 may be equal or greater than 9 V, preferably at least 90 V. The voltage at the ADC line 14 of the first I/O processing unit 12 and of the second I/O processing unit 13 may be less than 5 V, and is preferably between 1.5 V and 3 V.

The first I/O processing unit 12 may have at least two time windows, the duration of which are different from each other, during which the power switch 9 is controlled.

The timing of the switching off of the voltage can be done in many different ways. For example, in a run mode (normal operation) when the controllable power switch is used to switch on the voltage output from the power source 11, the time window can be 50% (relationship 1:1 between time switched on and time switched off). So the power supply 11 can be connected for 50 ms, during which time window the sensor 10 is measured by both first I/O processing unit 12 and second I/O processing unit 13. Then the power supply 11 is disconnected by controlling the power switch 9 for 50 ms. In this manner, the power dissipation in the measurement circuit can be reduced by ca. 50%.

In idle mode, when the elevator car is not moving and the elevator machinery is not operated, it suffices to read the sensor 10 more seldomly. Then after the measurement (for 50 ms, for example), for the duration of a time window of 450 ms, for example, the power supply 11 can be disconnected. In this manner, the power dissipation can be reduced by 90%.

In the standby mode, the power supply 11 can remain disconnected so that the measurement circuit will not dissipate any power.

The first I/O processing unit 12 may be configured to delay switching of the power switch 9 for a predetermined period after informing the second I/O processing unit 13 or after having been commanded by the second I/O processing unit 13.

The first I/O processing unit 12 is configured to switch the controllable power switch on for 10 to 50 ms and then to switch it off.

An elevator comprises an elevator car movable in a hoistway, the elevator car having at least one automatic or turnable car door, a number of automatic or turnable hoistway doors, and a safety system 1 configured to control the safety of the at least one automatic or turnable car door and the number of hoistway doors.

The sensor connecting unit 2 is preferably configured to use a shorter time-off window to measure safety when the elevator is in normal operation mode and a longer time-off window when the elevator is in idle mode. Preferably, in standby-mode the controllable power switch 9 may remain switched off.

FIGS. 2 to 6 illustrate alternative embodiments for making the second I/O processing unit 13 know that the power switch 9 (or, alternatively, the controllable power supply) will be switched off by the first I/O processing unit 12

Figure 2:
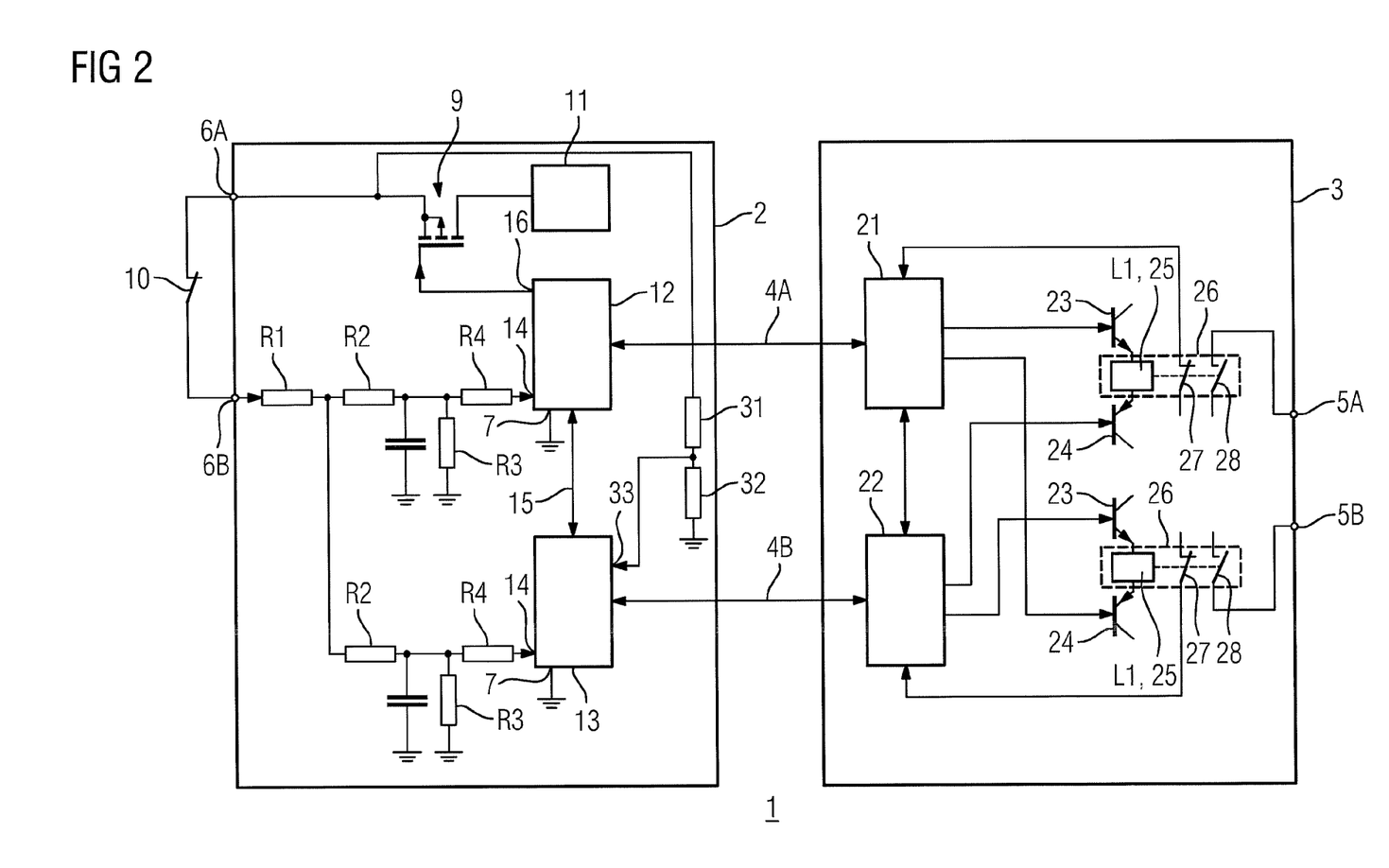
FIG. 2 illustrates the safety system of FIG. 1, one I/O processing unit controlling the controllable switch and the second I/O processing unit detecting the switching of the controllable switch by measurement.

In the embodiment shown in FIG. 2, the second I/O processing unit 13 measures the output of the controllable power switch 9 and is the most reliable way to carry out the determining of the power switch 9 status. For the measurement, resistors 31 and 32 are most preferably used to reduce the voltage suitable for the input line 33 of the second I/O processing unit 13.

Figure 3:
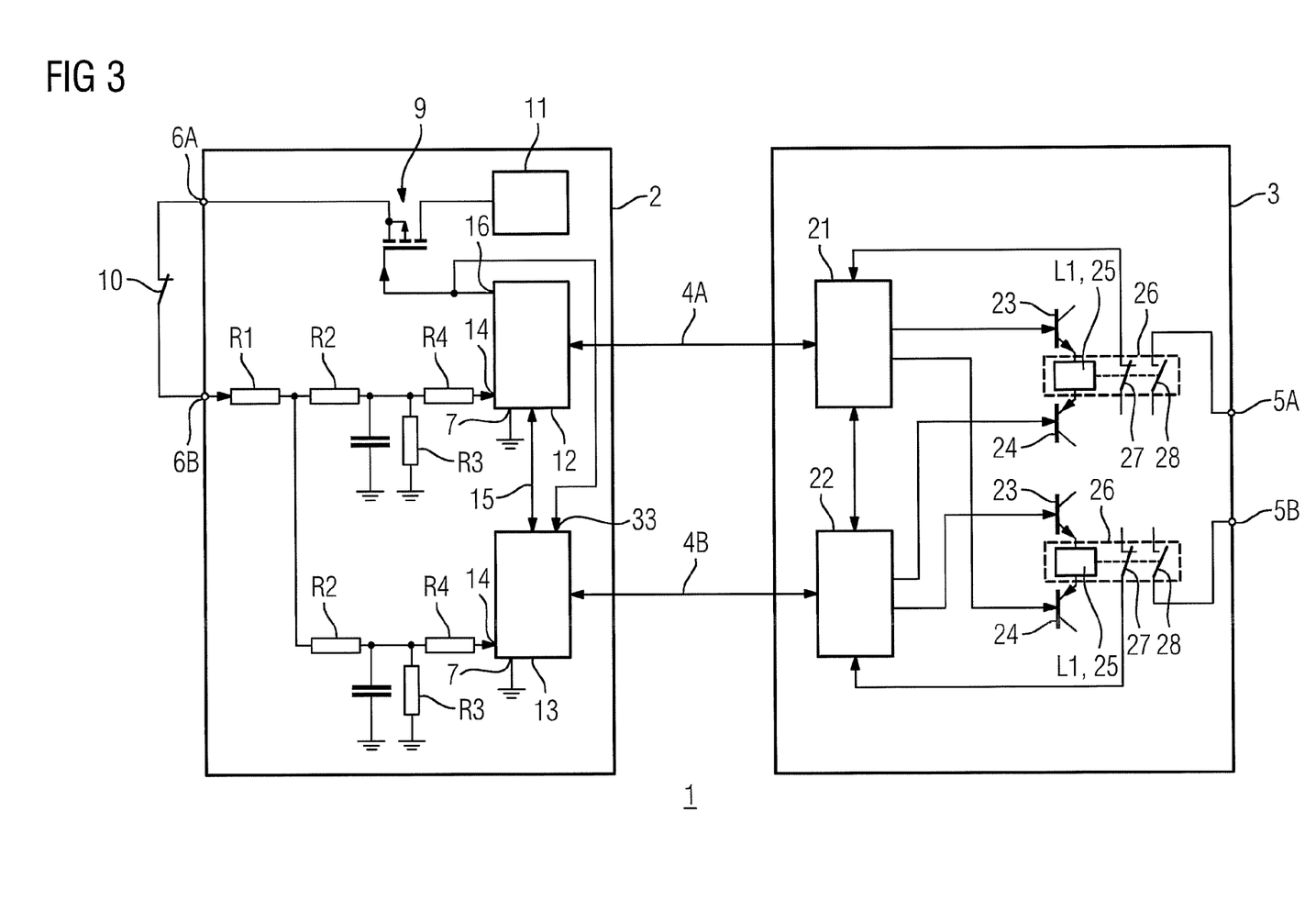
FIG. 3 illustrates the safety system of FIG. 1, one I/O processing unit controlling the controllable power switch, the control signal being branched to the other I/O processing unit.
Figure 4:
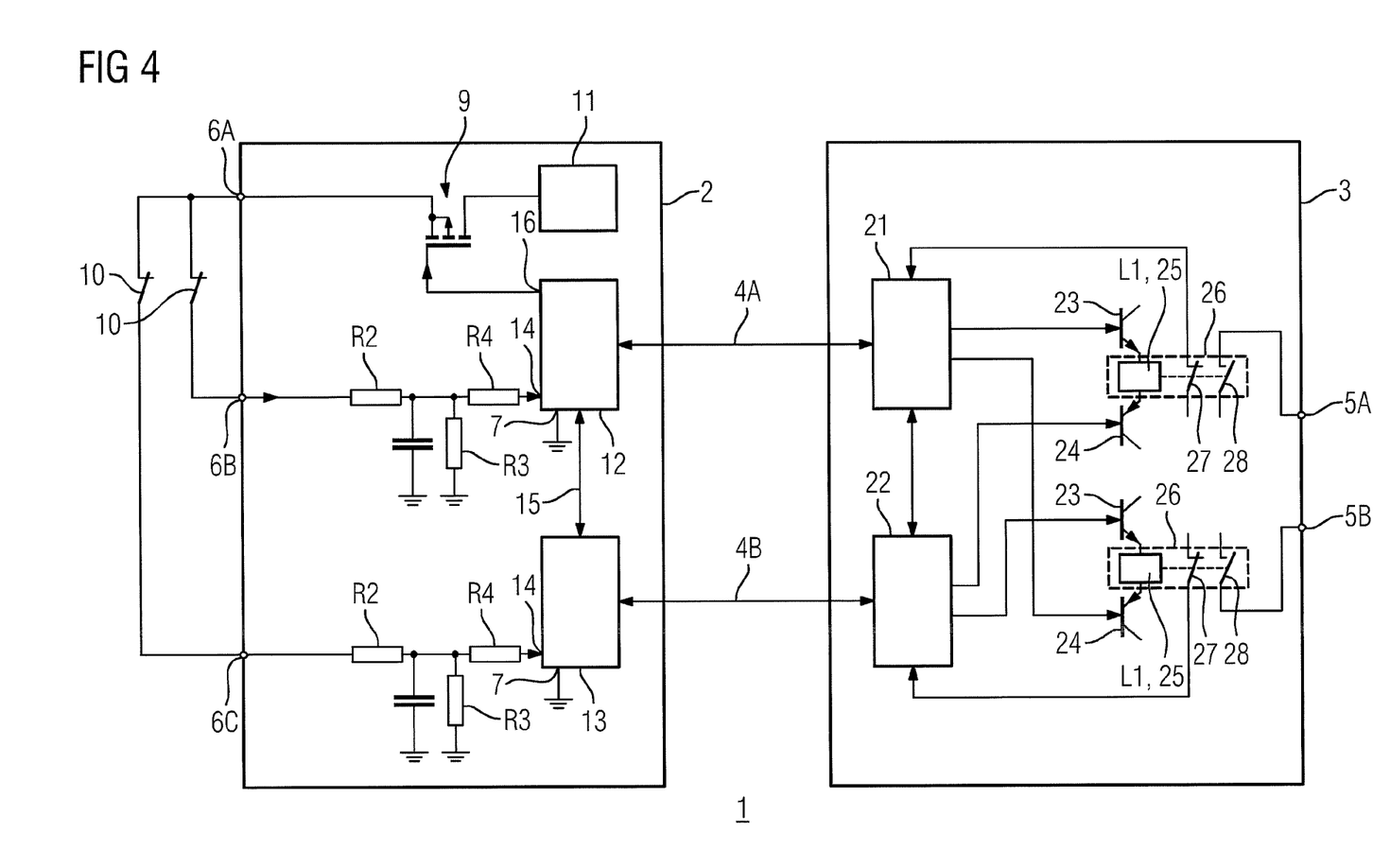
FIG. 4 illustrates the safety system having two sensors, each of which is connected between a sensor input supply and a sensor input so that each unit connected to a sensor through a safety input supply and a safety input, one I/O processing unit informing the other I/O processing unit through a reciprocal comparison communication channel.
Figure 5:
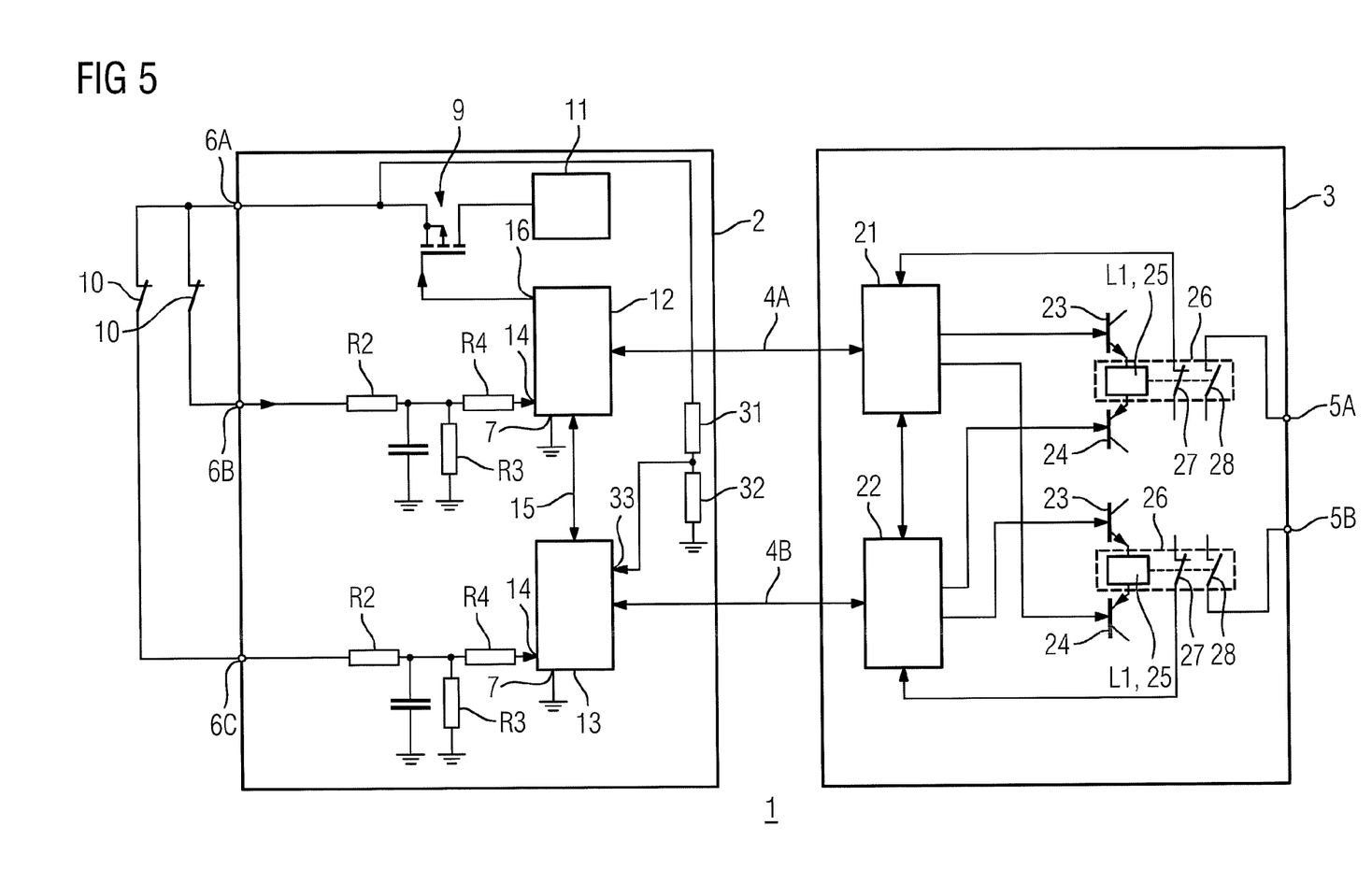
FIG. 5 illustrates the safety system of FIG. 4, one I/O processing unit controlling the controllable switch and the second I/O processing unit detecting the switching of the controllable switch by measurement.
Figure 6:
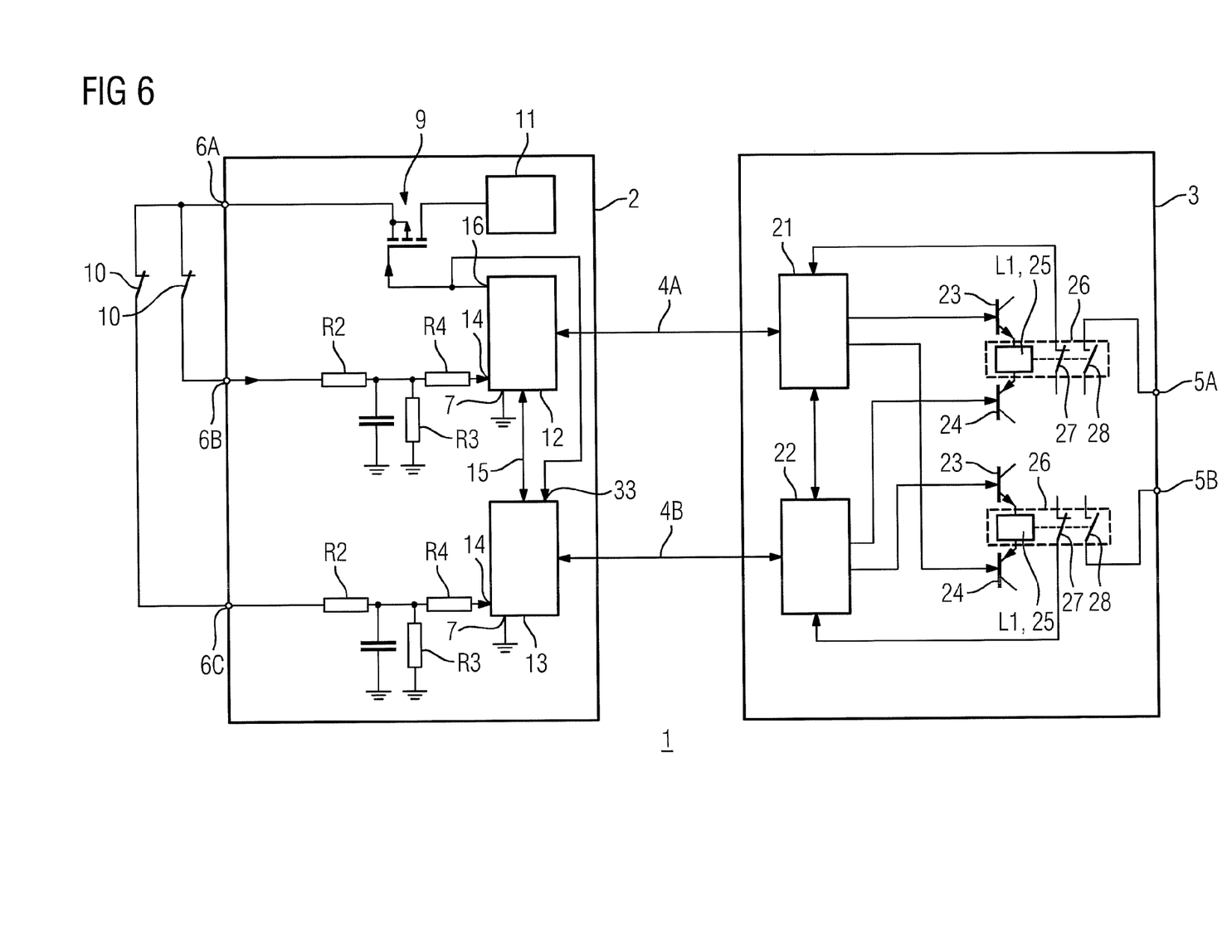
FIG. 6 illustrates the safety system of FIG. 4, one I/O processing unit controlling the controllable power switch, the control signal being branched to the other I/O processing unit.

In the embodiment shown in FIG. 3, the first I/O processing unit 12 informs the second I/O processing unit 13 about switching of the power switch 9 through an input line 33 branched from a control line used to control the controllable power switch 9. The embodiments shown in FIGS. 4 to 6 differ from those shown in FIGS. 1 to 3, respectively, with regard to the number of sensors 10 (now there are two sensors 10 instead of one sensor 10) and in that there is a dedicated safety input 6B, 6C for each of the sensors 10.

The sensor connecting unit 2 and the safety system can be installed in an elevator, such as in a passenger and goods passenger lift, or in inclined travel path lift, escalator or moving walk.

The invention is presented with the aid of the above exemplary embodiments. The exemplary embodiments are not meant to limit the scope of the patent protection applied for, but the scope of protection can vary and differ from the exemplary embodiments within the framework of the attached claims and their legal equivalents.

LIST OF REFERENCE NUMERALS USED

R1, R2, R3, R4 resistors
C1, C2 capacitors
L1, L2 inductances
1 safety system
2 sensor connecting unit
3 safety logic unit
4A, 4B safety bus
5A, 5B safety output
6A safety input supply
6B, 6C safety input
7 reference input
9 controllable power switch
10 sensor
11 power supply
12 I/O processing unit
13 I/O processing unit
14 ADC line
15 reciprocal comparison communication channel
16 power switch control 21 safety logic processing unit
22 safety logic processing unit
23 controllable power switch
24 controllable power switch
25 relay coil
26 safety relay
27 break contact switch
28 make contact switch
31, 32 resistors
33 input line

The invention claimed is:

1. A sensor connecting unit, comprising:
a sensor connected between a safety input supply and a safety input, or, alternatively, a first sensor connected between the safety input supply and a first safety input and a second sensor connected between the safety input supply and a second safety input,
said sensor, or, alternatively, said first sensor and second sensor being safety sensor(s) installed in association with an elevator;
a power supply that is connected to the safety input supply and controllable through a controllable power switch, or, alternatively, a controllable power supply, the power supply or the controllable power supply being controllably supplying power to the sensor, or, alternatively, the first or second sensor, and switching off power from a power source to the sensor, or, alternatively, the first or second sensor;
a first I/O processing unit and a second I/O processing unit being connected to each other through a reciprocal comparison communication channel, and are connected to a safety bus; and
a first measurement circuit connected between the first I/O processing unit and the safety input, or alternatively, the first safety input, and a second measurement circuit connected between the second I/O processing unit and the safety input, or alternatively, the second safety input, the first and second measurement circuits being configured to measure voltage, current or power between a common ground and the safety input, or, alternatively between the common ground and the first and second safety input respectively,
wherein when the power supply or the controllable power supply is controllably switching off power from the power source to the sensor, or, alternatively, the first or second sensor, the first and second measurement circuits will not dissipate any power,
wherein the first I/O processing unit has been configured to control the controllable power switch or, alternatively, the controllable power supply for power supply of the sensor, or, alternatively, the first or second sensor, and
wherein operation includes:
i) the first I/O processing unit has been configured to inform the second I/O processing unit about switching of the power switch or, alternatively, of the controllable power supply for power supply of the sensor, or, alternatively, the first or second sensor, including said switching off of the power switch or, alternatively, of the controllable power supply, and
ii) the second I/O processing unit has been configured to command the first I/O processing unit to switch the power switch or, alternatively, of the controllable power supply for power supply of the sensor, or, alternatively, the first or second sensor, through the reciprocal comparison communication channel, including said switching off of the power switch or, alternatively, of the controllable power supply.

2. The sensor connecting unit according to claim 1, wherein: the first I/O processing unit is configured to delay switching of the power switch or, alternatively, of the controllable power supply, for a predetermined period after informing the second I/O processing unit; or
the first I/O processing unit is configured to delay switching of the power switch or, alternatively, of the controllable power supply, for a predetermined period after having been commanded by the second I/O processing unit.

3. The sensor connecting unit according to claim 1, wherein: the first I/O processing unit is configured to switch the controllable power switch on for 10 to 50 ms and then to switch the controllable power switch off.

4. The sensor connecting unit according to claim 1, wherein: the first and second measurement circuits are configured to dissipate electric power form the power supply, or alternatively, from the controllable power supply, and/or to lead electric current to ground so that a voltage over the sensor, or, alternatively, the first or second sensor, is reduced in the first and second measurement circuits to a level accepted by an ADC line of the first I/O processing unit and of the second I/O processing unit.

5. The sensor connecting unit according to claim 4, wherein: the voltage over the sensor, or, alternatively, the first or second sensor, is equal or greater than 9 V, whereas the voltage at the ADC line of the first I/O processing unit and of the second I/O processing unit is less than 5 V.

6. The sensor connecting unit according to claim 1, wherein: the sensor, or, alternatively, the first or second sensor is a) a safety contact with at least one direct opening action contact, b) a safety switch with at least one safety output, or c) two or more non-safety switches.

7. The sensor connecting unit according to claim 1, wherein: the first I/O processing unit has at least two off-time windows, a duration of which are different from each other, during which the power switch or, alternatively, the controllable power supply, is switched off.

8. The sensor connecting unit according to claim 1, wherein: the safety sensor connecting unit is integrated in a safety logic unit.

9. The sensor connecting unit according to claim 1, wherein:
the safety sensor connecting unit has been installed in a passenger and goods passenger lift, an inclined travel path lift, an escalator or a moving walk.

10. A safety system, comprising: a number of sensor connecting units according to claim 1, and a number of safety logic units connected or connectable to the number of sensor connecting units locally and/or through a safety bus and having a first safety output and a second safety output.

11. The safety system according to claim 10, wherein: the safety system has been installed in a passenger and goods passenger lift, an inclined travel path lift, an escalator or a moving walk.

12. An elevator, comprising:
an elevator car movable in a hoistway, the elevator car having at least one automatic or turnable car door;
a number of automatic or turnable hoistway doors; and
the safety system according to claim 10 and configured to control the safety of the at least one automatic or turnable car door and the number of hoistway doors.

13. The elevator according to claim 12, wherein: the sensor connecting unit is configured to use a shorter off-time window to measure safety when the elevator is in normal operation mode and a longer off-time window when the elevator is in idle mode.

14. The sensor connecting unit according to claim 2, wherein:
   the first I/O processing unit is configured to switch the controllable power switch on for 10 to 50 ms and then to switch the controllable power switch off.

15. The sensor connecting unit according to any claim 2, further comprising:
   a sensor connected between a safety input supply and the safety input; or
   a first sensor connected between the safety input supply and the first safety input and a second sensor connected between the safety input supply and the second safety input.

16. The sensor connecting unit according to claim 2, further comprising:
   a sensor connected between a safety input supply and the safety input; or
   a first sensor connected between the safety input supply and the first safety input and a second sensor connected between the safety input supply and the second safety input.

17. The sensor connecting unit according to claim 1, wherein the first I/O processing unit is configured to inform the second I/O processing unit about switching of the power switch or, alternatively, of the controllable power supply through the reciprocal comparison communication channel.

18. The sensor connecting unit according to claim 1, wherein the first I/O processing unit is configured to inform the second I/O processing unit about switching of the power switch or, alternatively, of the controllable power supply through an input line branched from a control line used to control the controllable power switch.

19. The sensor connecting unit according to claim 1, wherein the first I/O processing unit is configured to inform the second I/O processing unit about switching of the power switch or, alternatively, of the controllable power supply through the controllable power supply.

* * * * *